(12) United States Patent
Ball

(10) Patent No.: US 6,539,855 B2
(45) Date of Patent: *Apr. 1, 2003

(54) METHOD AND APPARATUS FOR SCREEN PRINTING

(75) Inventor: Michael B. Ball, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/863,094

(22) Filed: May 22, 2001

(65) Prior Publication Data

US 2001/0025574 A1 Oct. 4, 2001

Related U.S. Application Data

(63) Continuation of application No. 09/258,437, filed on Feb. 26, 1999, now Pat. No. 6,234,077.

(51) Int. Cl.[7] .............................................. B05C 17/04
(52) U.S. Cl. ....................... 101/123; 101/129; 118/406
(58) Field of Search ................................ 101/114, 115, 101/116, 123, 124, 129, 41, 42; 118/213, 406, 504

(56) References Cited

U.S. PATENT DOCUMENTS

| | | | |
|---|---|---|---|
| 3,589,283 A | 6/1971 | Childress | 101/115 |
| 3,934,502 A | 1/1976 | Marino | 101/115 |
| 4,409,924 A | 10/1983 | Laverty et al. | 118/406 |
| 4,622,239 A | 11/1986 | Schoenthaler et al. | 427/96 |
| 4,655,784 A | 4/1987 | Rahman | 8/148 |
| 4,937,097 A | 6/1990 | Ichinose et al. | 427/96 |
| 5,050,498 A | 9/1991 | Smith | 101/127.1 |
| 5,148,355 A | 9/1992 | Lowe et al. | 361/410 |
| 5,176,076 A | 1/1993 | Azuma et al. | 101/123 |
| 5,185,040 A | 2/1993 | Sakai et al. | 118/406 |
| 5,287,806 A | 2/1994 | Nanzai | 101/123 |
| 5,588,359 A | 12/1996 | Hofmann et al. | 101/128.21 |
| 5,738,009 A | 4/1998 | Desie et al. | 101/129 |

*Primary Examiner*—Ren Yan
(74) *Attorney, Agent, or Firm*—Schwegman, Lundberg, Woessner & Kluth, P.A.

(57) ABSTRACT

A screen printing apparatus and method for forming printed wiring on a substrate, such as a wafer. The apparatus includes a reservoir disposed beneath a screen having a plurality of openings forming a pattern thereon. Disposed within the reservoir is a printing paste. The screen is pressed into the printing paste such that convex structures are formed on the upper surface of the screen, and are printable onto the substrate. A wiper is also movably disposed within the reservoir, cooperating with the screen to establish contact between the screen and the substrate.

28 Claims, 2 Drawing Sheets

METHOD AND APPARATUS FOR SCREEN PRINTING

This application is a Continuation of U.S. application Ser. No. 09/258,437, filed Feb. 26, 1999 now U.S. Pat. No. 6,234,077.

FIELD OF THE INVENTION

The present invention relates generally to a method and apparatus for screen printing. More particularly, it pertains to printing a screen paste through a medium onto a substrate.

BACKGROUND OF THE INVENTION

Circuit patterns are produced by a number of manners, including screen printing. Typically, in a screen printer a screen having a printing pattern, is disposed over an object to be printed. Printing ink is coated onto the screen, and then spread by the use of a wiper also disposed over a top surface of the screen. The wiper assists in the printing of the pattern onto the object to be printed. One example of a conventional screen printer is illustrated in U.S. Pat. No. 5,176,076 issued to Azuma on Jan. 5, 1993.

Typical screen printers, however, can result in excessive material costs. The printing paste is disposed on the screen for each application and can dry out and solidify rapidly due to the repeated working of the paste, as well as its exposure to air. In addition, cleaning issues also occur as the paste dries on the screen in between uses. Other areas which challenge conventional screen printers is uniformity in the thickness of application of the printing medium. The printing paste undergoes changes such as solidification, oxidation, etc. from being left on the screen when not in operation, which results in an undesirable printing effect. Thus, the paste must be removed from the screen and replaced with new printing paste. Replacement of the paste requires additional material and additional labor. Furthermore, solidification of the paste can result in variations in thicknesses of the paste application leading to excessive use of the paste, thereby further adding to the overall cost of the unit.

Accordingly, what is needed is a screen printer which overcomes the above waste and cleaning problems. What is further needed is a screen printer which assists in preventing the drying of printing paste between applications. What is also needed is a screen printer which provides a uniform application of material.

SUMMARY OF THE INVENTION

A screen printing apparatus is disclosed which includes a substrate which is adapted to receive a printing substance. The substrate can include devices such as a wafer or a printed circuit board. The apparatus further includes a printing screen having a top surface and a bottom surface, where the top surface is disposed toward the substrate. A retention device is also coupled with the substrate, and the retention device retains the substrate over the top surface of the printing screen. Further included is a reservoir for containing a printing paste, such as solder, where the reservoir has a plurality of side surfaces and a bottom surface. The reservoir is disposed below the bottom surface of the printing screen.

In one embodiment, a wiper assembly is associated with the reservoir, where the wiper assembly includes a wiper and a reciprocating assembly. In another embodiment, the printing screen is flexed toward the substrate, and/or the top surface of the printing screen contacts the object to be printed. A retention device, in yet another embodiment, retains the substrate over the printing screen mechanically or by a vacuum. Alternatively, in another embodiment, a movement assembly is provided which is coupled with the printing screen. The movement assembly is adapted to provide paste on the printing screen, for example, in the form of convex bumps, or alternatively, to force paste through the printing screen. In another embodiment, a heater is thermally coupled with the reservoir.

A screen printing apparatus includes a substrate which is adapted to receive a printing substance. The substrate can include devices such as a wafer or a printed circuit board. The apparatus further includes a printing screen having a top surface and a bottom surface, where the top surface is disposed toward the substrate. A retention device is also coupled with the substrate, and the retention device retains the substrate over the top surface of the printing screen. Further included is a reservoir for containing a printing paste, such as solder, where the reservoir has a plurality of side surfaces and a bottom surface. The reservoir is disposed below the bottom surface of the printing screen. Associated with the reservoir is a wiper assembly, where the wiper assembly includes a wiper and a reciprocating assembly. In another embodiment, the printing screen is flexed toward the substrate, and/or the top surface of the printing screen contacts the object to be printed. A retention device, in yet another embodiment, retains the substrate over the printing screen mechanically or by a vacuum.

A further embodiment includes a method of screen printing onto a surface of a substrate. The method comprises disposing a bottom surface printing screen within a reservoir of a printing medium, contacting a top surface of the printing screen with a substrate; and translating a wiping mechanism over the printing screen, causing the printing medium to be disposed on the substrate. In another embodiment, the method further includes flexing the printing screen toward the substrate with the wiping mechanism.

The printing apparatus advantageously aids in producing consistent bump heights, particularly when trying to obtain a bump higher than the width of the bump. The viscosity of the printing paste is also better controlled, in part, due to the use of the heater. In addition, by containing the print medium in a reservoir below the screen, automation of the screen printing operation is much easier since it is not necessary to dispense print medium onto the screen between applications.

The printing apparatus provides a combination of pressure squeegee forces that is not currently available in standard screen-print equipment. This adds another control of the print medium, which would be useful to dispense accurate and consistent solder paste height and width characteristics. By utilizing the additional pressure control, it is possible to successfully use print medium with higher variations in viscosity and thixotropic index.

The screen printing apparatus also dispenses a predetermined amount of printing paste having a predetermined temperature onto the printing screen in each printing cycle. The apparatus assists in preventing the printing paste from being solidified and maintains a desired degree of viscosity. In addition, the apparatus aids in preventing the printing paste from being excessively applied onto the surface of the screen, which would otherwise result in uneven printing. Furthermore, the below-described printing apparatus minimizes the amount of printing paste which is wasted.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

Figure 1:
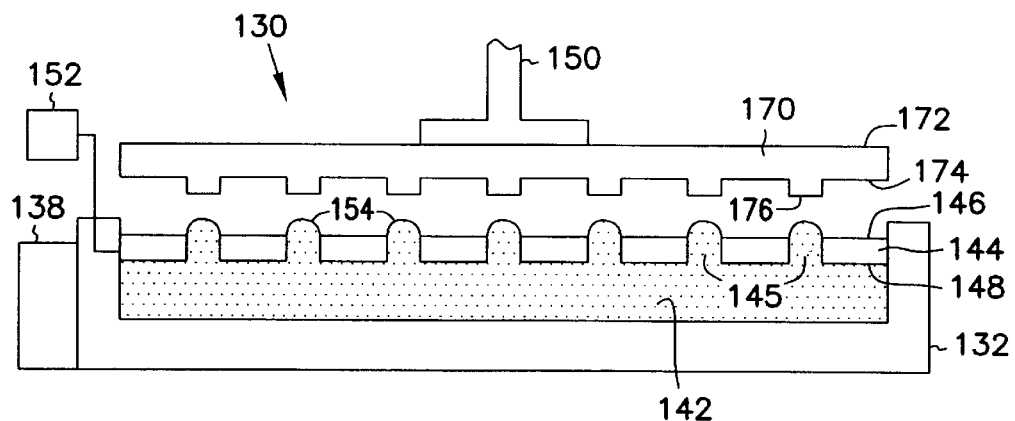
FIG. 1 is a side elevational view illustrating a screen printing apparatus constructed in accordance with one embodiment of the present invention.
Figure 2:
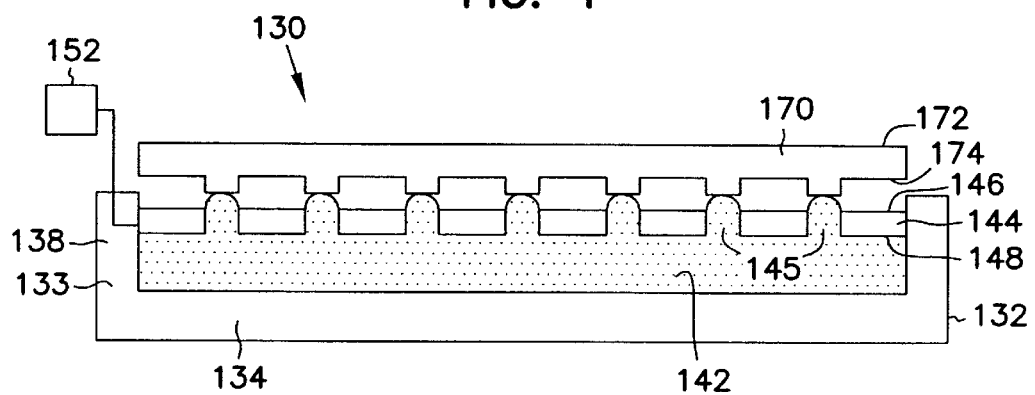
FIG. 2 is a side elevational view illustrating a screen printing apparatus constructed in accordance with one embodiment of the present invention.
Figure 3:
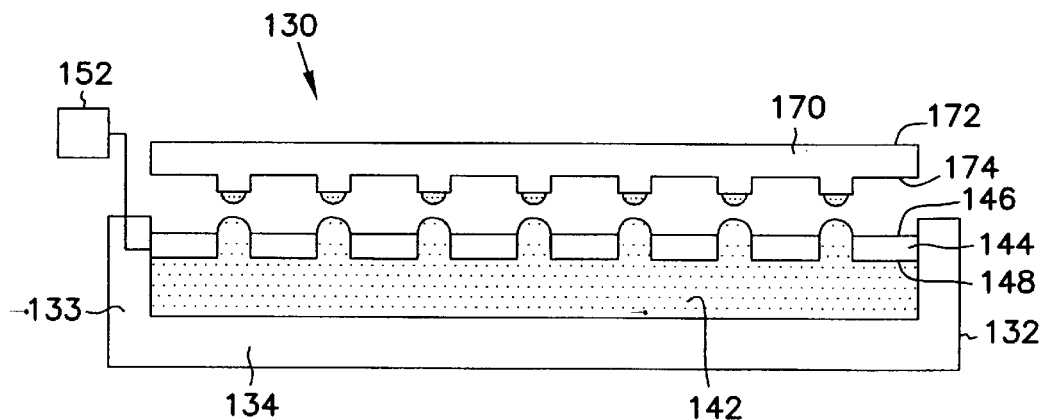
FIG. 3 is a side elevational view illustrating a screen printing apparatus constructed in accordance with one embodiment of the present invention.

A screen printing apparatus is illustrated in FIGS. 1–3. A screen printer 130 is provided which generally includes a reservoir 132, a printing screen 144, and a substrate 170. The screen printer 130 allows for a printing medium, such as a printing paste, to be printed onto the substrate 170 in a redetermined pattern, as further discussed below.

The reservoir 132 comprises a container for containing a printing paste 142, therein, and includes side surfaces 133 and a bottom surface 134. In one embodiment, the reservoir 132 includes a heater 138 coupled therewith. The heater 138 is thermally coupled with the reservoir 132 and is adapted to control the temperature of the printing paste container therein. Controlling the temperature of the printing paste advantageously allows for better control of the height and width of the distribution of paste.

The printing screen 144 comprises a template which contains a plurality of apertures 145 therein. The apertures 145 are disposed within the printing screen 144 such that they form a pattern thereon. Other shapes can be formed alternative to or in conjunction with the apertures 145 to achieve a multitude of patterns. The printing screen 144 is defined by an upper surface 146 and a lower surface 148.

Coupled with the printing screen 144, in one embodiment, is a movement assembly 152. The movement assembly 152 is operatively coupled with the printing screen 144 and is adapted to translate the movement assembly 152 upwards and downwards relative to the reservoir 132. The movement assembly 152 comprises, in one embodiment, a servo motor. Alternatively, other devices for translating the printing screen 144 can also be used.

The movement assembly 152, in another embodiment, controls the velocity and pressure of the printing screen 144 as it approaches the printing paste 142 of the reservoir 132. By controlling these variables, as well as others, the amount, height, and width of the printing paste 142 disposed on the printing screen 144 can also be controlled. In yet another embodiment, the movement assembly 152 transfers the print screen 144 into the printing paste 142 such that convex paste bumps 154 are formed on the upper surface 146 of the printing screen 144, as shown in FIGS. 2 and 3. The movement assembly 152 controls the force of the printing screen 144 as it is being disposed within the paste 142, thereby controlling the rate of paste passed through the apertures 145 of the printing screen 144.

As mentioned above, the substrate 170 provides a surface on which printing occurs. The substrate 170 is defined by an upper surface 172 and a lower surface 174, and in one embodiment, includes at least one pad 176 on the lower surface 174. The substrate 170 can include a wafer, a printed circuit board, or other alternatives. The substrate 170 is retained over the upper surface 146 of the printing screen 144, where the lower surface 174 of the substrate 170 is disposed toward the upper surface 146 of the printing screen 144 in preparation for the printing process. In one embodiment, the substrate 170 is retained over the printing screen 144 by a retention device 150. The retention device 150 comprises, in one embodiment, a vacuum. In another embodiment, the retention device 150 comprises a mechanical fastener which couples with a portion of the substrate 170. The retention device 150 allows for the printing process to be easily automated, as well as reducing time and cost of the printing process.

During use, the substrate 170 travels to the screen printer 130, and arrives at a position above the printing screen 144, as illustrated in FIG. 1. In one embodiment, the movement assembly 152 transfers the printing screen 144 within the printing paste 142, thereby acquiring printing paste 142 on the printing screen 144. In one embodiment, the printing screen 144 is disposed within the printing paste 142, forcing printing paste 142 through the apertures 145 to form convex paste bumps 154 thereon. The printing screen 144 is transferred from the printing paste 142 proximate to the substrate 170, until the printing paste 142 contacts and adheres to the lower surface 174 of the substrate 170, as illustrated in FIG. 3. Alternatively, the upper surface 146 of the printing screen 144 contacts the lower surface 174 of the substrate 170 to cause the printing of the printing paste 142 on the substrate 170. Unused paste 142 falls back to the reservoir 132 to be reused before it dries out.

Figure 4:
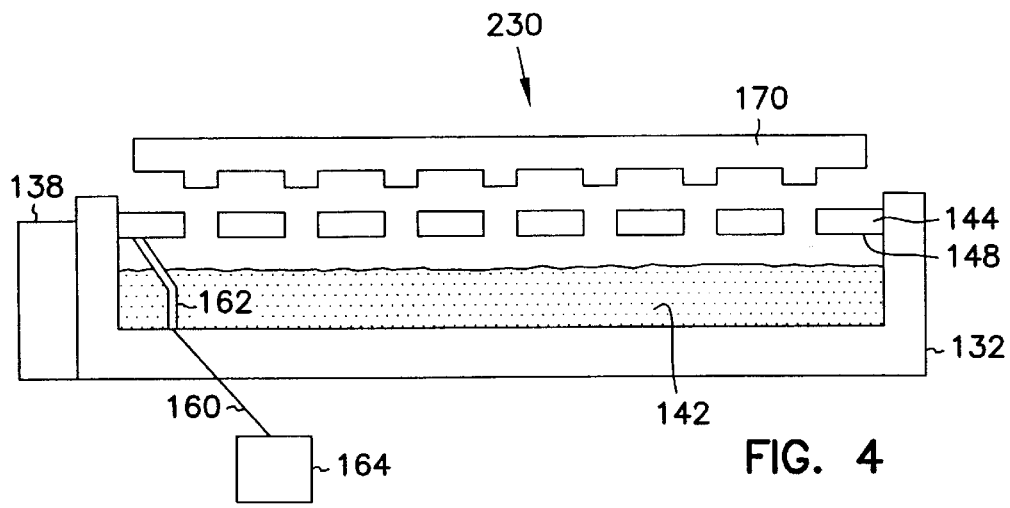
FIG. 4 is a side elevational view illustrating a screen printing apparatus constructed in accordance with another embodiment of the present invention.
Figure 5:
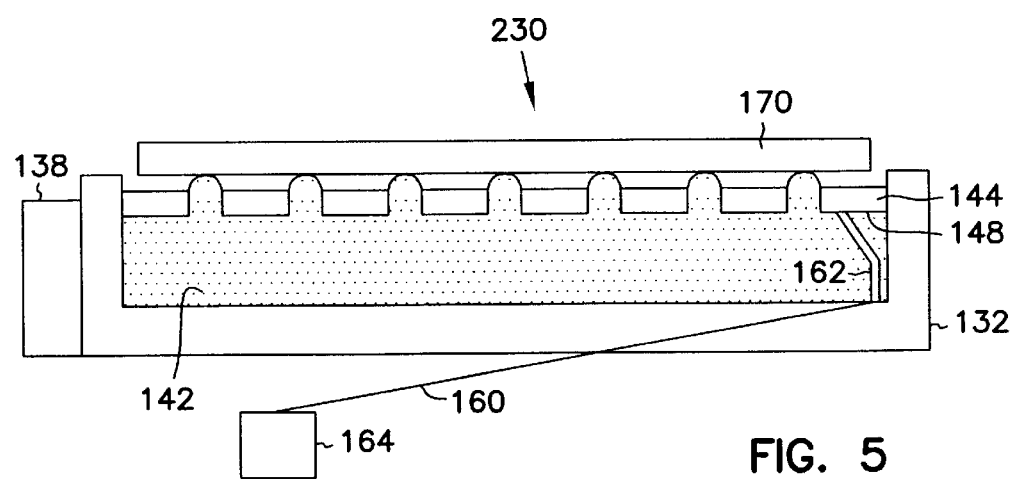
FIG. 5 is a side elevational view illustrating a screen printing apparatus constructed in accordance with one embodiment of the present invention.

In another embodiment, as shown in FIG. 4, a screen printer apparatus 230 is provided. The apparatus 230 includes similar components as those discussed above. In addition, the screen printer 130 includes a wiper assembly 160. The wiper assembly 160, in one embodiment, is coupled with the reservoir 132. The wiper assembly 160, in one embodiment, includes a wiper 162 and a reciprocating assembly 164 operatively coupled with the wiper 162. The reciprocating assembly 164 provides a mechanism to transfer the wiper 162 across the printing screen 144 and controls the velocity and pressure of the wiper 162, in one embodiment, using a servo motor, a hydraulic ram, or other alternatives. In one embodiment, the wiper 162 comprises an elongate structure which operates as a squeegee against the lower surface 148 of the printing screen 144. As the wiper 162 is forced over the lower surface 148 of the printing screen 144, printing paste 142 is forced through the apertures 145, as shown in FIG. 5.

During use, the substrate 170 travels to the screen printer 130, and arrives at a position above the printing screen 144. The wiper assembly 160 actuates the wiper 162, and the wiper 162 is moved while kept in contact with the screen under a predetermined pressure and velocity. When the wiper 162 is moved across the printing screen 144, a printing paste 142 is forced through the pattern of apertures 145 formed on the printing screen 144, resulting in a printing paste 142 being disposed through the printing screen 144 to the upper surface 146 of the printing screen 144 (see FIG. 4). The substrate 170 is brought into contact with the printing paste 142 of the printing screen 144 to thereby form the pattern of printing paste 142 on the lower surface 174 of the substrate 170, as illustrated in FIG. 5.

Figure 6:
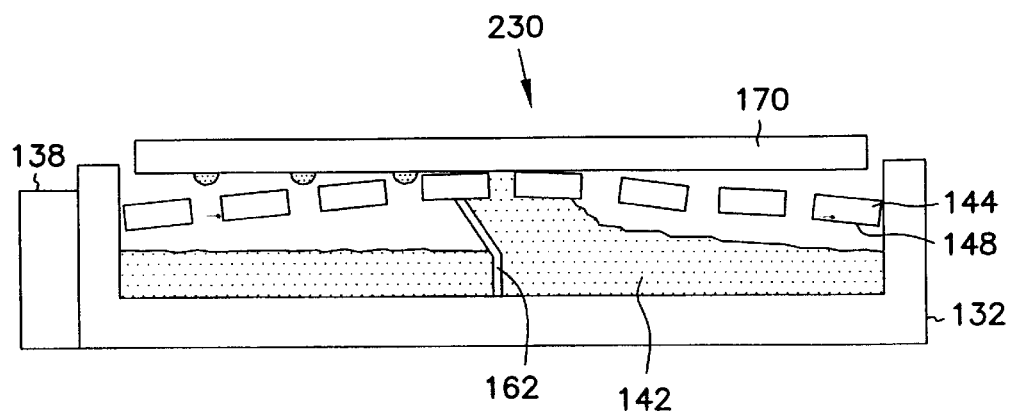
FIG. 6 is a side elevational view illustrating a screen printing apparatus constructed in accordance with yet another embodiment of the present invention.

In one embodiment, the printing screen 144 contacts the lower surface 174 of the substrate 170. This is achieved by raising the printing screen 144 using a movement assembly 152 for the printing screen 144, as discussed above for FIGS. 1–3. Alternatively, in another embodiment, the printing screen 144 is brought into contact with the substrate 170 using the wiper assembly 160. For this embodiment, as shown in FIG. 6, the wiper 162 is forced against the lower surface 148 of the printing screen 144 and the printing screen 144 flexes toward the substrate 170. In yet another embodiment, the substrate 170 is lowered toward the printing screen 144 as the printing screen 144 is raised up from the reservoir 132. It should be noted that the above discussed embodiments can be combined to achieve the printing on the substrate 170.

The screen printing apparatus provides several advantages in that a cleaner and more controllable printing process is achieved. Since the pressure and velocity of the printing screen movement is controlled, more consistent bump heights are achieved, particularly when trying to obtain a bump higher than the width of the bump. By utilizing the additional pressure control, it is possible to successfully use print medium with higher variations in viscosity and thixotropic index. In addition, since the printing paste is contained in the reservoir, it is also possible to use a material with higher viscosity. The heater coupled with the reservoir also allows for control of the viscosity, and the reservoir assists in preventing rapid drying and unnecessary waste of the printing paste.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A screen printing assembly comprising:
   a substrate;
   a flexible printing screen having a top surface and a bottom surface, the top surface of the flexible printing screen faces upward toward the substrate, the flexible printing screen having a non-flexed position and a flexed position; and
   a reservoir disposed below the bottom surface of the printing screen.

2. The screen printing assembly as recited in claim 1, further comprising a means for retaining the substrate in a position over the flexible printing screen and the reservoir.

3. The screen printing assembly as recited in claim 1, further comprising a means for flexing the flexible printing screen toward the substrate.

4. The screen printing assembly as recited in claim 1, wherein in the flexed position, the flexible printing screen is flexed toward the substrate.

5. A screen printing assembly comprising:
   a substrate;
   a flexible printing screen having a top surface and a bottom surface, the top surface of the flexible printing screen faces upward toward the substrate;
   a means for flexing the flexible printing screen; and
   a reservoir disposed below the bottom surface of the flexible printing screen.

6. The screen printing assembly as recited in claim 5, wherein the means for flexing the flexible printing screen contacts the flexible printing screen with the substrate.

7. The screen printing assembly as recited in claim 5, further comprising a wiper assembly operatively coupled with the reservoir, the wiper assembly including a wiper and a reciprocator coupled with the wiper.

8. The screen printing assembly as recited in claim 7, wherein the wiper assembly is disposed within the reservoir.

9. A screen printing assembly comprising:
   a substrate;
   a flexible, non-rigid printing screen having a top surface and a bottom surface, the top surface of the flexible, non-rigid printing screen faces upward toward the substrate; and
   a reservoir disposed below the bottom surface of the flexible, non-rigid printing screen,
   a means for moving the flexible, non-rigid printing screen relative to the reservoir.

10. The screen printing assembly as recited in claim 9, wherein the means for moving the flexible, non-rigid printing screen moves the flexible, non-rigid printing screen toward the reservoir.

11. The screen printing assembly as recited in claim 9, wherein the means for moving the flexible, non-rigid printing screen moves the flexible, non-rigid printing screen toward the substrate.

12. The screen printing assembly as recited in claim 9, wherein the means for moving the flexible, non-rigid printing screen flexes a portion of the flexible, non-rigid printing screen.

13. The screen printing assembly as recited in claim 9, wherein the flexible, non-rigid printing screen is in a single plane, and the means for moving the flexible, non-rigid printing screen moves the entire flexible, non-rigid printing screen relative to the reservoir.

14. A screen printing assembly comprising:
   a substrate;
   a flexible printing screen having a top surface and a bottom surface, the top surface of the flexible printing screen faces upward toward the substrate;
   a reservoir disposed below the bottom surface of the flexible printing screen; and
   a wiper assembly including a wiper and a reciprocator coupled with the wiper, the wiper forced against the bottom surface of the flexible printing screen.

15. The screen printing assembly as recited in claim 14, wherein the wiper is disposed within the reservoir and the flexible printing screen is in a flexed position in contact with the substrate.

16. The screen printing assembly as recited in claim 14, further comprising a means for retaining the substrate over the flexible printing screen and the reservoir.

17. The screen printing assembly as recited in claim 14, further comprising a heater operatively coupled with the reservoir.

18. A screen printing assembly comprising:

a substrate;

a flexible printing screen having a top surface and a bottom surface, the top surface of the flexible printing screen faces upward toward the substrate;

a reservoir disposed below the bottom surface of the flexible printing screen;

a wiper assembly including a wiper and a reciprocator coupled with the wiper, the wiper forced against the bottom surface of the flexible printing screen, and the wiper is disposed within the reservoir.

19. The screen printing assembly as recited in claim 18, further comprising a retention device that mechanically retains the substrate over the printing screen and the reservoir.

20. The screen printing assembly as recited in claim 18, further comprising a means for moving the flexible printing screen toward the reservoir.

21. A method comprising:

disposing a bottom surface of a flexible printing screen toward a reservoir;

retaining a substrate over a top surface of the flexible printing screen;

flexing the flexible printing screen toward the substrate; and printing a pattern on the substrate.

22. The method as recited in claim 21, further comprising contacting a top surface of the printing screen with the substrate.

23. The method as recited in claim 21, further comprising translating a wiping mechanism over the flexible printing screen and causing the pattern to be printed on the substrate.

24. The method as recited in claim 21, further comprising heating the reservoir.

25. The method as recited in claim 21, further comprising forcing a wiping mechanism against the bottom surface of the flexible printing screen.

26. A method comprising:

disposing a bottom surface of a flexible printing screen toward a reservoir;

retaining a substrate over a top surface of the flexible printing screen;

translating a wiping mechanism over the flexible printing screen;

flexing the flexible printing screen toward the substrate;

contacting a top surface of the printing screen with the substrate; and printing a pattern on the substrate.

27. The method as recited in claim 26, wherein translating the wiping mechanism over the flexible printing screen includes translating the wiping mechanism over the bottom surface of the flexible printing screen.

28. The method as recited in claim 26, further comprising moving the wiping mechanism within the reservoir.

* * * * *